United States Patent
Mouli

(10) Patent No.: US 8,278,182 B2
(45) Date of Patent: Oct. 2, 2012

(54) ISOLATION STRUCTURE FOR A MEMORY CELL USING $Al_2O_3$ DIELECTRIC

(75) Inventor: Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/314,976

(22) Filed: Dec. 8, 2011

(65) Prior Publication Data
US 2012/0083093 A1    Apr. 5, 2012

Related U.S. Application Data

(60) Continuation of application No. 11/435,813, filed on May 18, 2006, now Pat. No. 8,084,806, which is a division of application No. 10/873,226, filed on Jun. 23, 2004, now Pat. No. 7,282,409.

(51) Int. Cl.
*H01L 21/02* (2006.01)
(52) U.S. Cl. ........ 438/400; 438/454; 438/257; 438/424; 257/316; 257/429; 257/E21.002; 365/222; 365/149; 365/63
(58) Field of Classification Search ........ 257/316, 257/429, 348, 350, 296, E21.002; 438/400, 438/257, 424, 454, 218, 228, 241; 365/222, 365/149, 63
See application file for complete search history.

(56) References Cited

U.S. PATENT DOCUMENTS

| | | | |
|---|---|---|---|
| 3,978,577 A | 9/1976 | Bhattacharyya et al. | |
| 4,015,281 A | 3/1977 | Nagata et al. | |
| 4,035,829 A | 7/1977 | Ipri et al. | |
| 4,994,893 A | * 2/1991 | Ozaki et al. | 257/306 |
| 5,677,231 A | 10/1997 | Maniar et al. | |
| 5,760,452 A | 6/1998 | Terada | |
| 5,821,573 A | 10/1998 | Schunke et al. | |
| 5,869,376 A | 2/1999 | Tomioka | |
| 5,903,026 A | 5/1999 | Gonzalez et al. | |
| 6,504,214 B1 | 1/2003 | Yu et al. | |

(Continued)

FOREIGN PATENT DOCUMENTS
JP    51-47032 B    12/1976
(Continued)

OTHER PUBLICATIONS

"Amorphus $(CeO_2)_{0.67}(Al_2O_3)_{0.33}$ high-$k$ gate dieleteric thin films on silicon," L. Yan, et al., published May 28, 2003.

"Effect of Polysilicon Gate on the Flatband Voltage Shift and Mobility Degradation for ALD-$Al_2O_3$ Gate Dieletric," J. H. Lee et al., © 2000 IEEE.

(Continued)

*Primary Examiner* — Thinh T Nguyen
(74) *Attorney, Agent, or Firm* — Dickstein Shapiro LLP

(57) ABSTRACT

The invention provides, in one exemplary embodiment, an isolation gate formed over a substrate for biasing the substrate and providing isolation between adjacent active areas of an integrated circuit structure, for example a DRAM memory cell. An aluminum oxide (Al2O3) is used as a gate dielectric, rather than a conventional gate oxide layer, to create a hole-rich accumulation region under and near the trench isolation region. Another exemplary embodiment of the invention provides an aluminum oxide layer utilized as a liner in a shallow trench isolation (STI) region to increase the effectiveness of the isolation region. The embodiments may also be used together at an isolation region.

8 Claims, 13 Drawing Sheets

U.S. PATENT DOCUMENTS

| | | |
|---|---|---|
| 6,545,904 B2 | 4/2003 | Tran |
| 6,759,699 B1 | 7/2004 | Chi |
| 6,834,019 B2 | 12/2004 | Tran et al. |
| 6,887,310 B2 | 5/2005 | Hwu et al. |
| 6,902,971 B2 | 6/2005 | Grudowski |
| 6,933,572 B2 | 8/2005 | Bhattacharyya |
| 2002/0135048 A1 | 9/2002 | Ahn et al. |
| 2002/0197823 A1 | 12/2002 | Yoo et al. |
| 2004/0042309 A1 | 3/2004 | Tran et al. |
| 2004/0077151 A1 | 4/2004 | Bhattacharyya |
| 2004/0092054 A1 | 5/2004 | Mouli et al. |

FOREIGN PATENT DOCUMENTS

| | | |
|---|---|---|
| JP | 52-6008 B | 1/1977 |
| JP | 3-16170 A | 1/1991 |
| JP | 5-211311 A | 8/1993 |
| JP | 2003-45957 A | 12/2003 |

OTHER PUBLICATIONS

"80 nm poly-silicon gated n-FETs with ultra-thin $Al_2O_3$ gate dielectric for ULSI applications," D.A. Buchanan et al., © 2000 IEEE.

"Si-Doped Aluminates for High Temperature Metal-Gate CMOS: Zr-Al-Si-O, A Novel Gate Dielectric for Low Power Applications," L. Manchanda, et al., Bell Laboratories, Lucent Technologies, Murray Hill, N.J. 07974, © 2000, IEEE.

"Electrically Enhanced Trench Isolation for ULSI Applications" IBM Technical Disclosure Bulletin, IBM Corp., vol. 32, No. 12, May 1, 1990, pp. 400-402, XP000105413 ISSN: 0018-8689; figures; New York, US.

"Inversion-Free Trench Isolation" IBM Technical Disclosure Bulletin, IBM Corp., vol. 33, No. 3B, Aug. 1, 1990, pp. 332-333, XP000124373 ISSN: 0018-8689; figures; New York, US.

\* cited by examiner

ISOLATION STRUCTURE FOR A MEMORY CELL USING $AL_1O_3$ DIELECTRIC

CROSS-REFERENCE TO RELATED APPLICATIONS

This application is a continuation of U.S. patent application Ser. No. 11/435,813, filed on May 18, 2006 now U.S. Pat. No. 8,084,806, which is a divisional of U.S. patent application Ser. No. 10/873,226, filed on Jun. 23, 2004, and issued as U.S. Pat. No. 7,282,409, the entirety of each of these applications is incorporated by reference herein.

FIELD OF THE INVENTION

The invention relates to an improved semiconductor structure for high density integrated circuit manufacturing and, in particular, to an improved isolation region for a memory device and a process for its formation.

BACKGROUND OF THE INVENTION

There are two major types of random-access memory cells, dynamic and static. Dynamic random-access memories (DRAMs) can be programmed to store a voltage which represents one of two binary values, but requires periodic reprogramming or "refreshing" to maintain this voltage for more than very short time periods. Static random-access memories are so named because they do not require periodic refreshing.

DRAM memory circuits are manufactured by replicating millions of identical circuit elements, known as DRAM cells, on a single semiconductor wafer. Each DRAM cell is an addressable location that can store one bit (binary digit) of data. In its most common form, a DRAM cell consists of two circuit components: a field effect transistor (FET) and a capacitor.

FIG. 1A illustrates two conventional DRAM cells 10; each cell 10 includes a capacitor 14 and an access transistor 12. For each cell 10, the capacitor 14 has two connections located on opposite sides of the capacitor 14. The first connection is to a reference voltage Vr, which is typically one half of the internal operating voltage (the voltage corresponding to a logical "1") of the memory circuit. The second capacitor connection is to the drain of the transistor 12. The gate of the transistor 12 is connected to a word line 18, and the source of the transistor is connected to a bit line 16. This connection enables the word line 18 to control access to the capacitor 14 by allowing or preventing a signal (a logic "0" or a logic "1") on the bit line 16 to be written to or read from the capacitor 14. FIG. 1C shows a cross-sectional view of the DRAM cell 10. FIG. 1B shows a portion of a DRAM memory array comprising DRAM cells 10. In FIG. 1B, each cell 10 sharing a given bit line 16 does not share a common wordline 18, and each cell 10 sharing a common wordline 18 does not share a common bit line 16.

DRAM manufacturing is a highly competitive business. There is continuous pressure to decrease the size of individual cells and to increase memory cell density to allow more memory to be squeezed onto a single memory chip. Cell sizes of six square feature area ($6F^2$) to four square feature area ($4F^2$) are desired (where F represents the minimum realizable photolithographic process dimension feature size). Isolation of devices on a DRAM memory thus becomes increasingly important as the size of each cell is decreased, thereby placing active areas (e.g., area 13 on FIG. 1B) of each cell in closer proximity to the active areas of other devices. Isolation is required in other integrated circuit structures as well.

Shallow trench isolation (STI) is one technique that can be used to isolate the active areas on a DRAM array or other integrated structures from one another. As shown in FIG. 1C, an isolation trench 17 formed in a substrate surface 1 may be used to isolate two adjacent DRAM memory cells, each having a capacitor 14, a transistor 12, and associated source/drain regions 19. In a typical STI isolation structure, a trench 17 is etched into the substrate and filled with one or more layers of dielectric material 15 to provide a physical and electrical barrier between adjacent active areas. Thus, an STI structure is formed by etching a trench and then filling it with a dielectric such as a chemical vapor deposited (CVD) or high density plasma (HDP) silicon oxide or silicon dioxide ($SiO_2$). The filled trench is then planarized by a chemical mechanical planarization (CMP) or etch-back process so that the dielectric remains only in the trench and its top surface remains level with that of the silicon substrate.

To enhance the isolation further, ions may be implanted into the silicon substrate in the area directly beneath the trench (not shown). However, there is a drawback associated with ion implantation beneath the trench; as noted, for example, in S. Nag et al., "Comparative Evaluation of Gap-Fill Dielectrics in Shallow Trench Isolation for Sub-0.25 micron Technologies," IEEE IEDM, pp. 841-844 (1996), ion implantation beneath the trench can result in high current leakage. In particular, when ions are implanted in the substrate close to the edges of the trench, current leakage can occur at the junction between the active device regions and the trench.

Further, and referring to FIG. 1C, although deeper STI regions may provide better isolation, there is a limit to how deep the STI region can be made. If the STI region is too deep, filling the trench 17 with oxide layers 15 will result in voids 11 or cracks in the trench. Thus, there is a desire and need to isolate active areas of memory devices without relying on a deep or doped trench region.

Isolation gates have also been proposed for providing device isolation in high-density integrated circuits. These gates typically use a thick oxide layer, like silicon dioxide, but they still rely on conventional implants to provide a strong accumulation layer at the substrate surface. Thus, conventional isolation gates still facilitate the presence of gate-induced drain leakage (GIDL).

There is needed, therefore, an isolation structure which can be used in high density applications, such as DRAM memory devices. There also exists a need for a simple method of fabricating such an isolation structure.

BRIEF SUMMARY OF THE INVENTION

One exemplary embodiment of the invention provides an isolation gate formed over a substrate for biasing the substrate and providing isolation between adjacent active areas of an integrated circuit structure, for example a DRAM memory cell. An aluminum oxide ($Al_2O_3$) is used as a gate dielectric, rather than a conventional gate oxide layer, to create a hole-rich accumulation region under and near the trench isolation region. Another exemplary embodiment of the invention provides an aluminum oxide layer utilized as a liner in a shallow trench isolation (STI) region to increase the effectiveness of the isolation region. The embodiments may also be used together at an isolation region.

BRIEF DESCRIPTION OF THE DRAWINGS

Additional advantages and features of the present invention will be apparent from the following detailed description and drawings which illustrate preferred embodiments of the invention, in which.

DETAILED DESCRIPTION OF THE INVENTION

In the following detailed description, reference is made to various specific exemplary embodiments in which the invention may be practiced. These embodiments are described with sufficient detail to enable those skilled in the art to practice the invention, and it is to be understood that other embodiments may be employed, and that structural, logical, and electrical changes may be made.

The terms "wafer" or "substrate" used in the following description may include any semiconductor-based structure that has a semiconductor surface. Wafer and structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide.

Figure 1A:
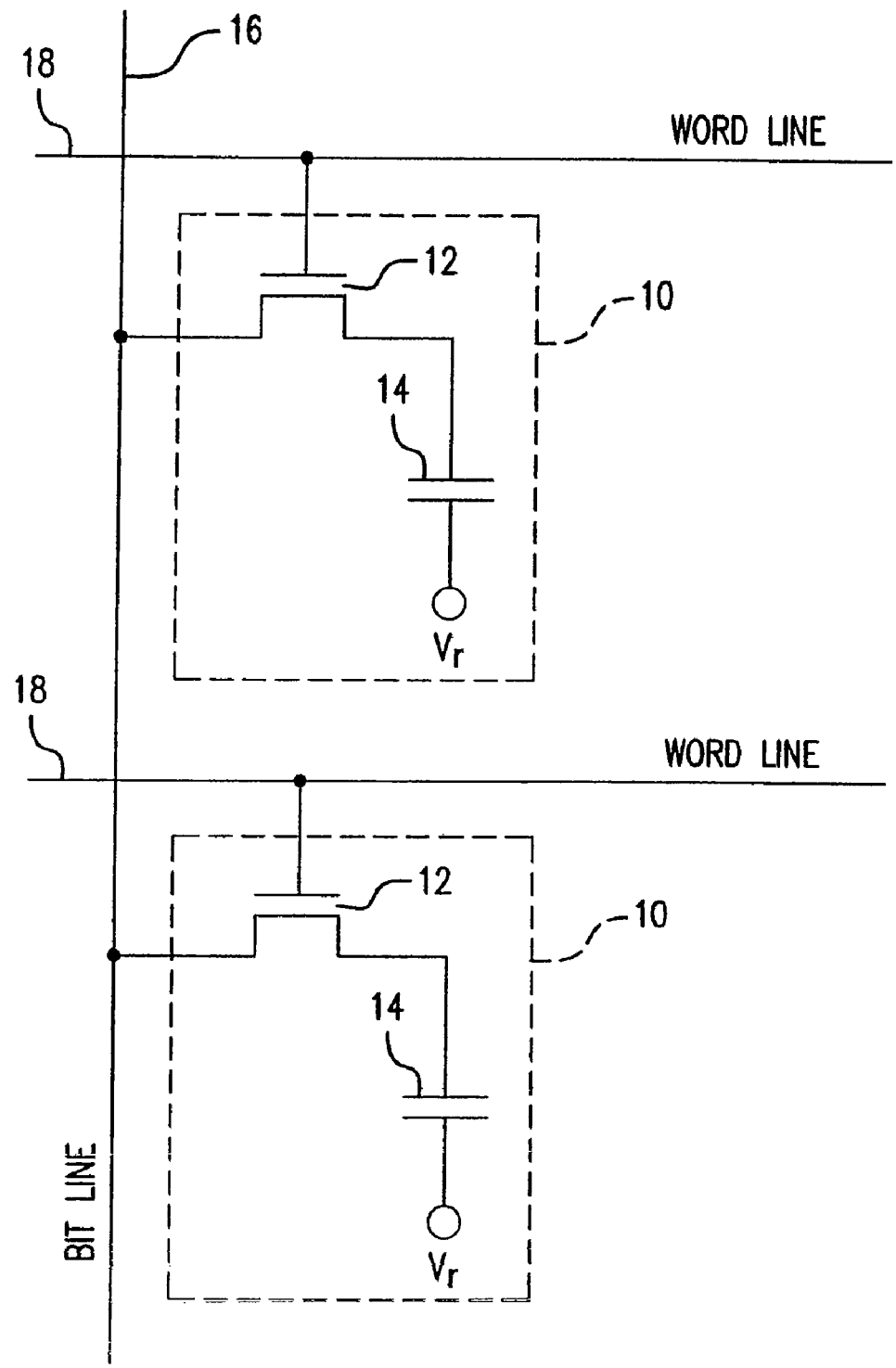
FIG. 1A illustrates two conventional DRAM cells in schematic form.
Figure 1B:
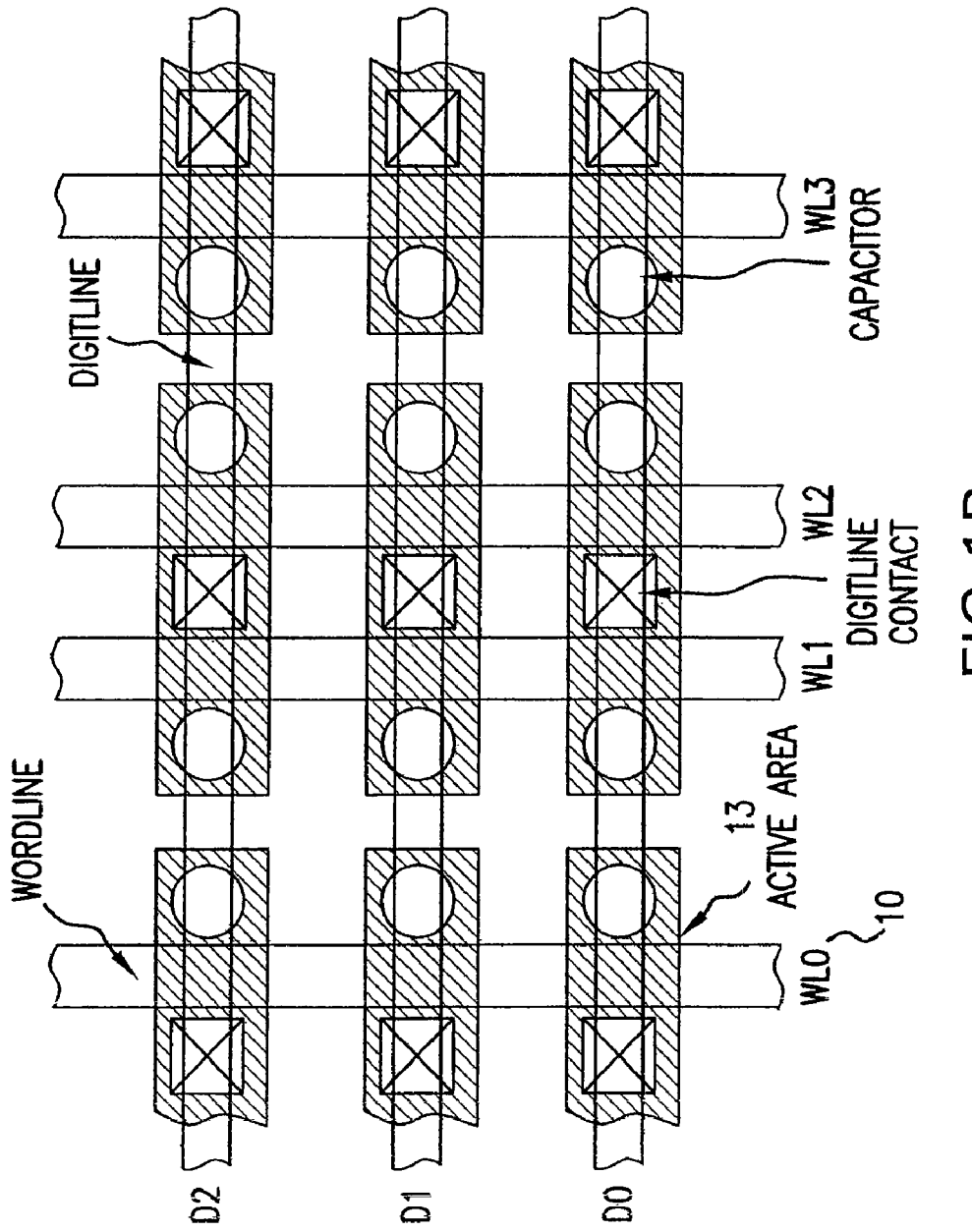
FIG. 1B illustrates a top-down view of a portion of a conventional DRAM array having DRAM cells constructed in accordance with FIG. 1A.
Figure 1C:
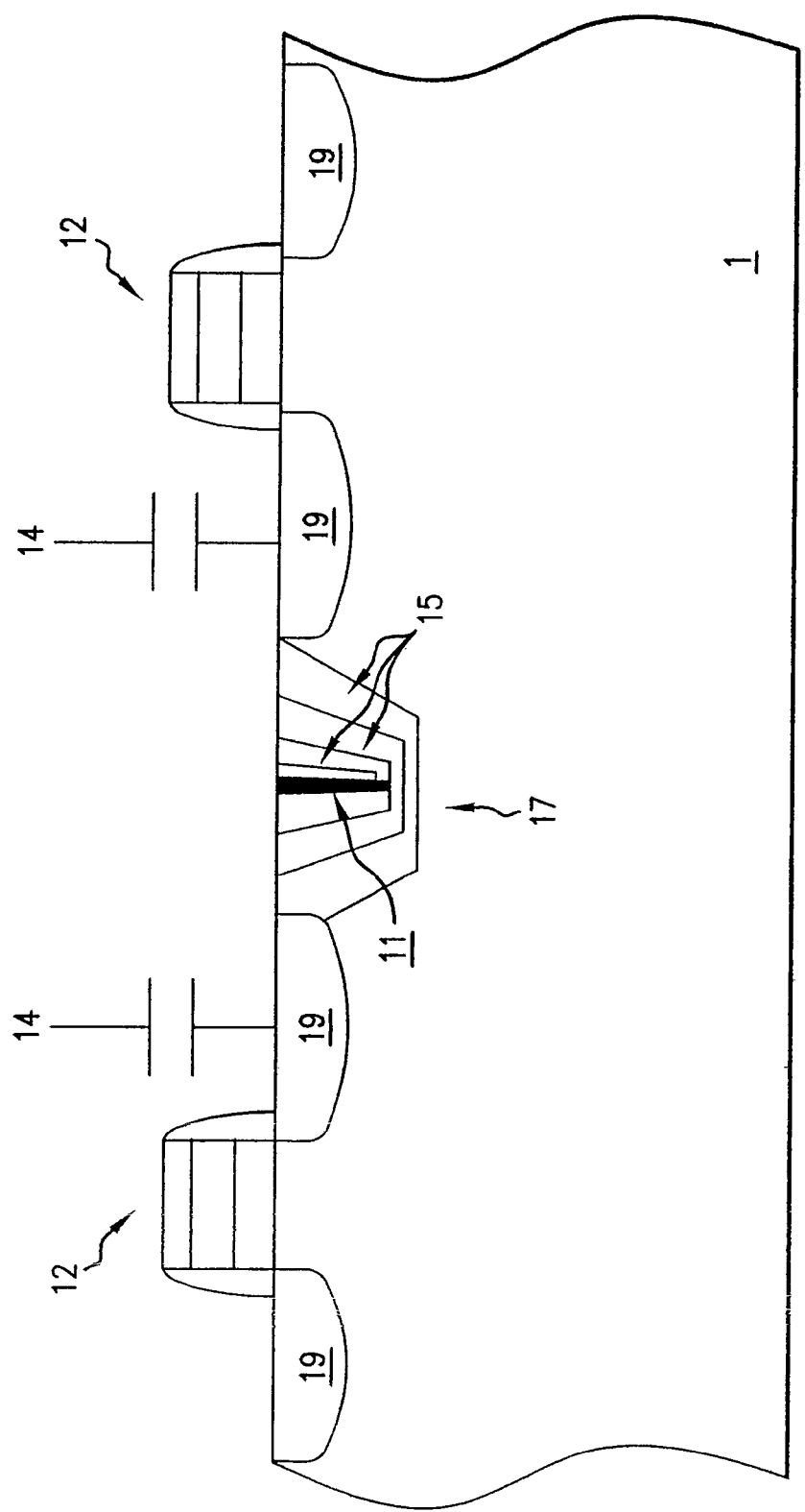
FIG. 1C is a cross-sectional view of the memory cells constructed as shown in the FIG. 1A memory cell circuit.
Figure 2A:
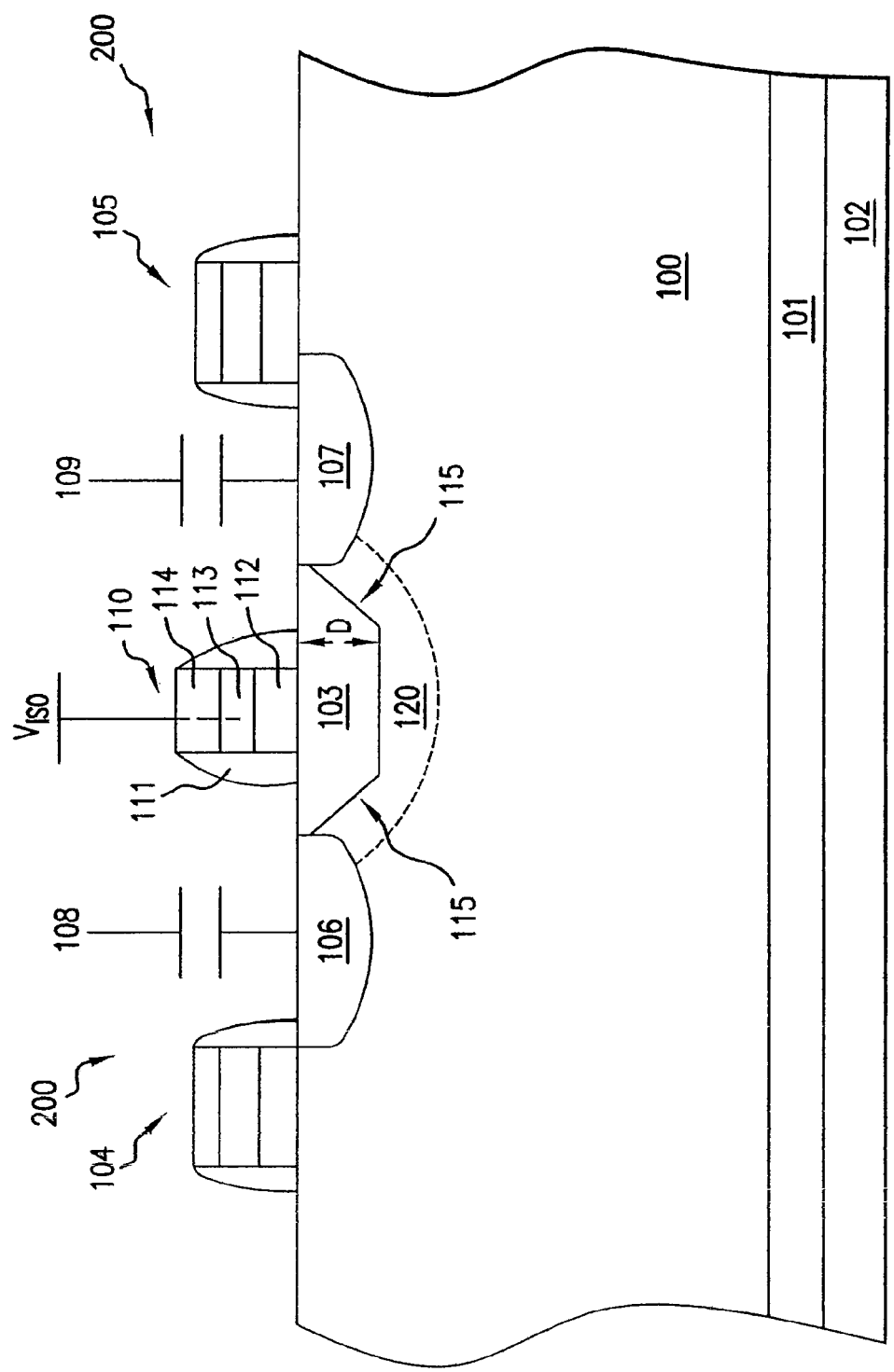
FIG. 2A is a cross-sectional view of portions of two adjacent memory cells constructed in accordance with a first exemplary embodiment of the present invention.
Figure 2B:
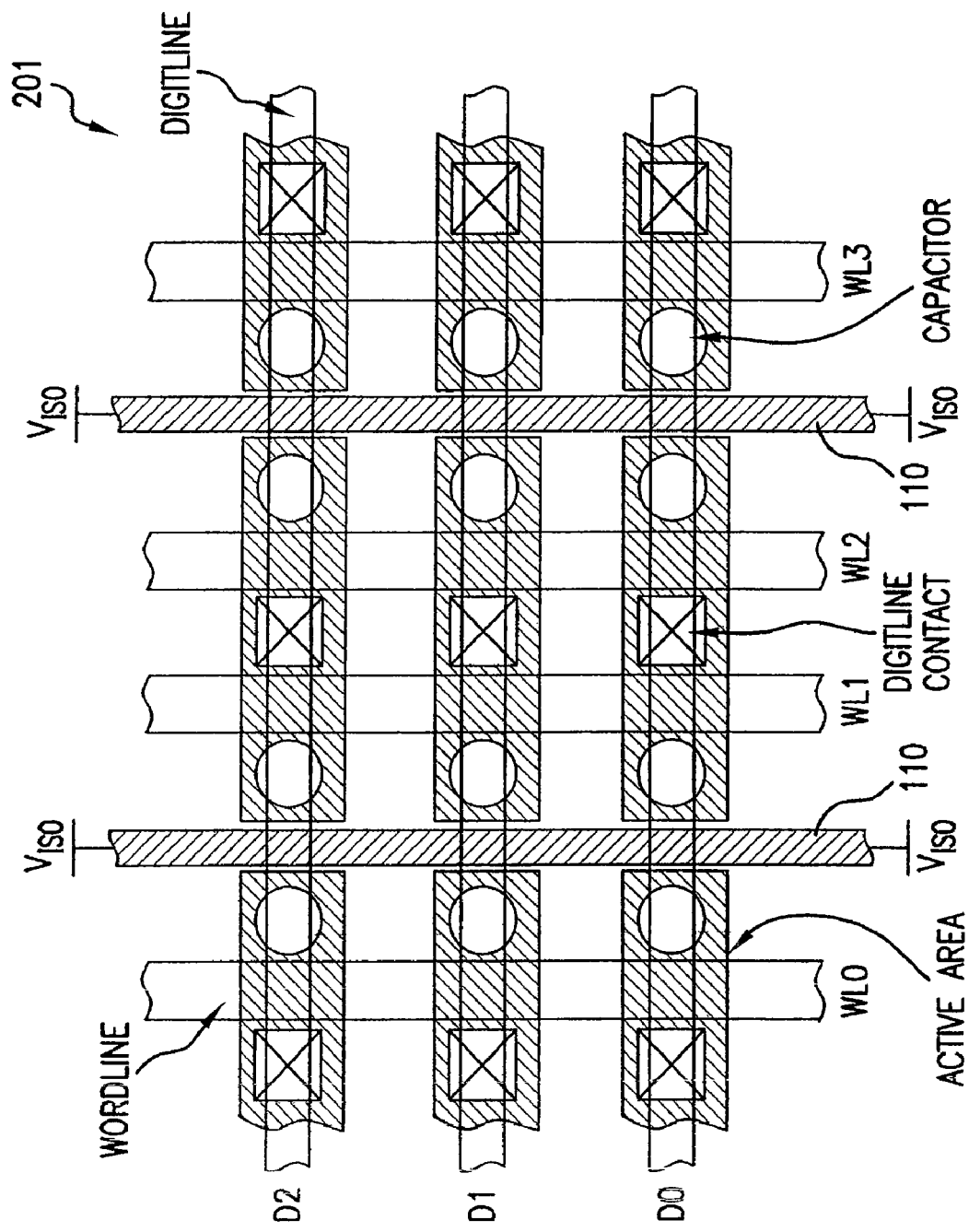
FIG. 2B is a portion of a memory array having memory cells constructed in accordance with FIG. 2A.

Referring now to the drawings, where like elements are designated by like reference numerals, a first exemplary embodiment of the invention is now described with reference to FIGS. 2A and 2B. FIG. 2A represents a cross-sectional view of portions of two exemplary DRAM memory cells 200 and FIG. 2B represents a top-down view of a partial DRAM array 201 configured with isolation gates 110 formed in accordance with a first embodiment of the present invention.

As discussed in more detail below, the isolation gate 110 of the first illustrated embodiment is preferably formed as a stacked gatestack. The isolation gate 110 has an insulating layer 114 over a conductive layer 113, which is over an aluminum oxide layer 112. Unlike the traditional grounded gate device, which contains a silicon dioxide ($SiO_2$) dielectric layer, the present invention proposes an aluminum oxide ($Al_2O_3$) gate dielectric layer 112. $Al_2O_3$ is a higher-k dielectric constant material (k~9.0) compared to silicon dioxide (k~3.9). Aluminum oxide creates a high negative charge density in the gate dielectric. Thus, placing aluminum oxide near the gate/p-type substrate interface, creates a hole accumulation layer near the surface of the substrate. The insulating layer 114 may be of any suitable material, such as a nitride. Suitable materials for the conductive layer 113 include, e.g., polysilicon, poly/$TiSi_2$, poly/$WSi_2$, poly/$WN_x$/W, poly/$WN_x$, poly/$CoSi_2$ and poly/$MoSi_2$. Oxide, nitride, or other insulating spacers 111 are provided on each side of the isolation gate 110.

Referring to FIG. 2A, the portions of the memory cells 200 are illustrated using a silicon on insulator (SOI) design with silicon layers 100, 102 and insulating layer 101, formed of, for example $SiO_2$. Each memory cell 200 may be formed on any semiconductor surface, however, and the invention is not limited to an SOI design, but is shown that way for exemplary purposes only.

As shown in FIG. 2A, an STI region 103 is created in substrate layer 100. A region 120 rich in positively charged holes is created along the STI sidewalls 115 and below the STI region 103 when the gate conductive layer 113 is biased by an isolation voltage $V_{ISO}$. This region 120 is created by providing and using the isolation gate 110, constructed in accordance with the invention, over the STI region 103.

In addition to the isolation gate 110, each memory cell 200 contains memory cell components such as transistors 104, 105 and a capacitive structure, shown schematically as a capacitors 108, 109. The transistors 104, 105 connect the memory cells 200 to an associated wordline, and the capacitors 108, 109 are electrically connected through the transistors 108, 109 to an associated bit line. The invention is, however, not limited to the embodiment of the cells 200 shown in FIG. 2A. The isolation gate 110 of this invention may be used for providing isolation between adjacent active areas within any integrated circuit device, such as with other memory cell configurations.

In operation, the isolation gate 110 is biased by applying a grounded potential or a slight potential to the isolation gate. As illustrated in FIGS. 2A and 2B, the potential $V_{ISO}$ represents the desired applied voltage for achieving sufficient isolation. It should be appreciated that the potential $V_{ISO}$ may be slightly positive or negative depending on the conductivity of the gate. For an NMOS isolation gate, the aluminum oxide is biased with a slightly negative charge, thereby inducing a hole-rich accumulation region 120 under the gate 110 in the STI region 103. A potential near the range of −50 to about −400 mV, typically about −100 mV, should be applied to the gatestack. If a PMOS isolation gate were utilized, a slightly positive potential would be applied to the gate in the range of about +50 to about +400 mV, typically about +100 mV. Biasing the isolation gate 110 provides electrical isolation between adjacent cells, or active areas in a cell, separated by the isolation gate 110 and corresponding isolation region 103. This electrical isolation is the result of the accumulation of electron holes along and beneath the STI region sidewalls 115, thereby preventing the flow of negative charges across this area.

In the first preferred embodiment of the invention, the aluminum oxide dielectric layer 112 produces a sufficient negative charge to keep a strong accumulation layer underneath the isolation gatestack 110 such that the gate may be maintained at ground potential. Accordingly, the isolation gate 110 of the present invention has a high threshold voltage so that when the gate is maintained at ground potential, a strong accumulation layer is created close to the surface of substrate layer 100 beneath the gate 110. For example, a typical field effect transistor in a DRAM cell, having a silicon dioxide dielectric layer, may have a threshold voltage of about 0.5 Volts. Utilizing an aluminum oxide layer 112 increases the threshold voltage of the isolation gate 110 to approximately 1.3 Volts. Although a higher threshold voltage is not always desired, in the illustrated embodiment, the higher threshold voltage is beneficial, providing an effective hole accumulation region 120.

Furthermore, the depth D of the trench isolation region 103 may be reduced when an isolation gate 110 is used in accordance with the invention. Generally, isolation trenches have a depth of about 2500 Å. However, the use of an isolation gate 110 in accordance with the invention allows the use of a trench 103 having a depth D of less than about 2000 Å; alternatively, in some cases, the use of an isolation trench may be altogether eliminated with sufficient device isolation being provided solely by the isolation gate formed directly on the substrate surface 100.

Referring now to FIGS. 3-7, an exemplary fabrication method performed in accordance with the first embodiment of the invention is now described. A silicon substrate layer 100 is provided. As mentioned above, the invention can be used with an SOI design, as shown in FIG. 2A; however, for the sake of simplicity, the remaining figures and description will describe a silicon substrate semiconductor design.

Figure 3:
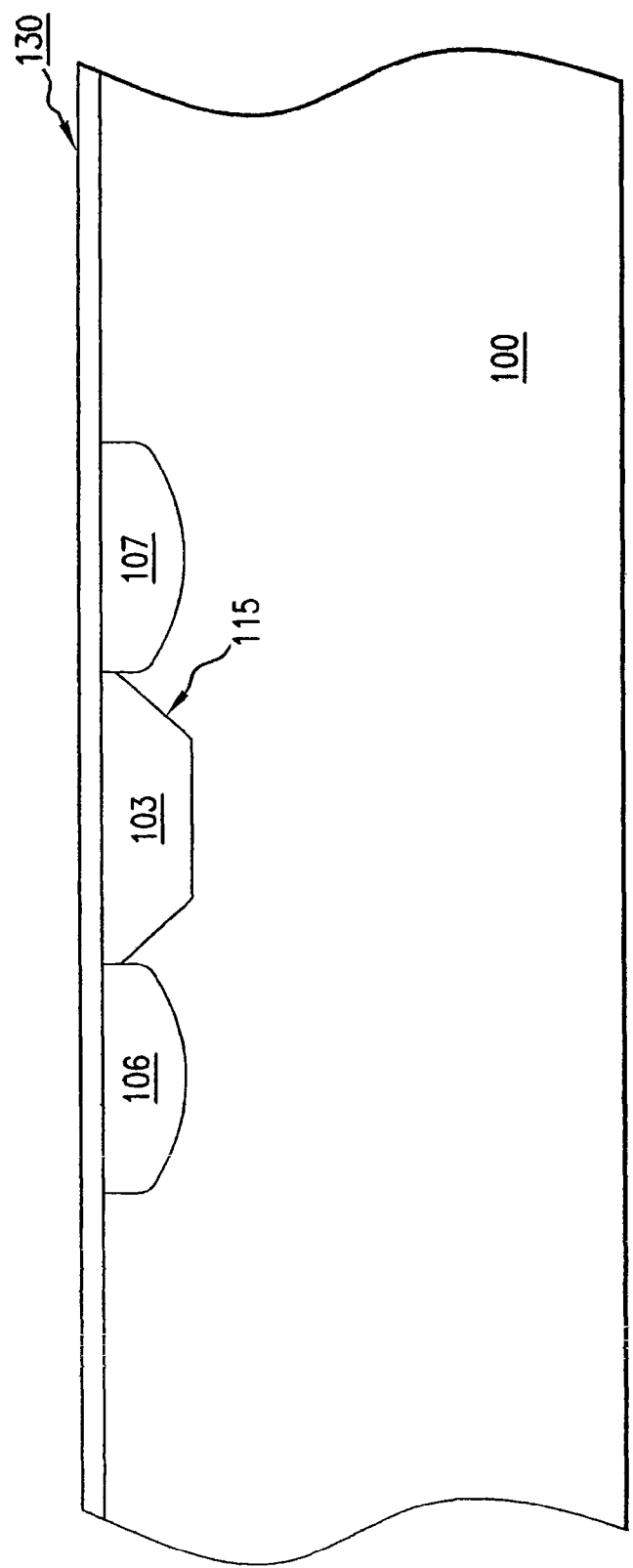
FIG. 3 is a cross-sectional view of an exemplary memory cell of the present invention at an initial stage of fabrication.

An initial stage of fabrication is now described with reference to FIG. 3. It is desirable that the STI regions 103 are formed in the substrate 100 prior to formation of the transistors 104, 105; and accordingly, it is desired that the isolation gate 110 is formed subsequent to the formation of the underlying source/drain regions 106, 107 that are located adjacent the isolation trench 103. The isolation trench 103 can be formed by any suitable method, such as by etching a trench by a dry anisotropic or other etching process. After etching, the trench is then filled with a dielectric, for example, by a chemical vapor deposited (CVD) or high density plasma (HDP) deposition of silicon oxide or silicon dioxide. Next, the filled trench 103 is planarized by a chemical mechanical polishing (CMP) or etch-back process so that the dielectric remains only in the trench and its top surface remains level with that of the silicon substrate 100. Source drain regions 106, 107 may be implanted regions using conventional implantation processes. Next, a very thin gate oxide layer 130 is grown everywhere over the surface of the substrate 100 to act as a buffer layer.

Figure 4:
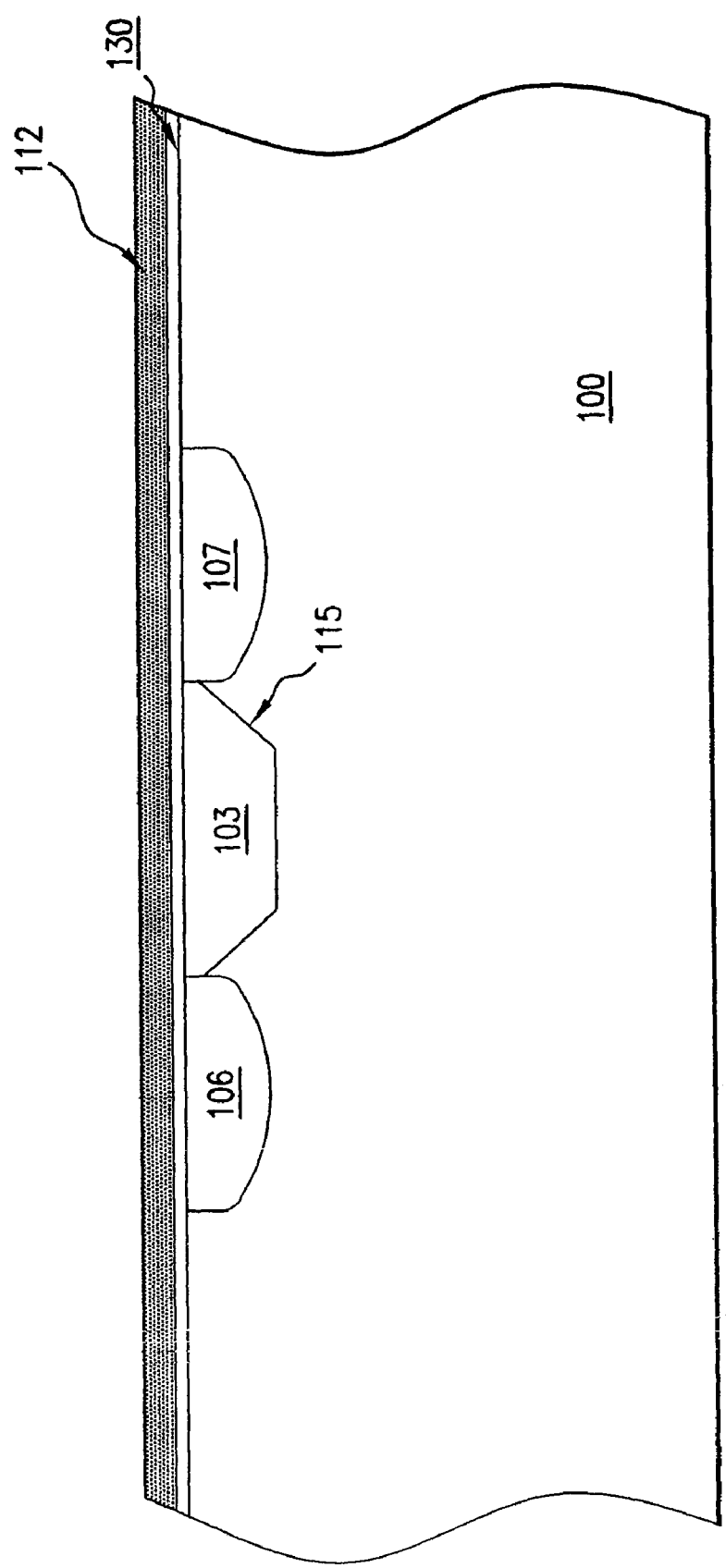
FIG. 4 is an illustration of the memory cell of FIG. 3 at a subsequent stage of fabrication.

FIG. 4 illustrates a subsequent step in fabricating the memory cell 200. A layer of aluminum oxide 112 is deposited to a desired thickness over the buffer layer 130. The deposition of the aluminum oxide layer 112 can be performed by any suitable method including, but not limited to, chemical vapor deposition (CVD), plasma vapor deposition, or atomic layer deposition. Because aluminum oxide is a higher-k material than conventional gate oxides, a thicker film layer may be utilized to provide the same effective oxide thickness as in the conventional DRAM cell. This is advantageous since depositing a thicker film allows more process control by reducing variation in film thickness across a large wafer. The thickness of the aluminum oxide film is generally about 50 to about 150 Angstroms, preferably 100-115 Angstroms.

Figure 5:
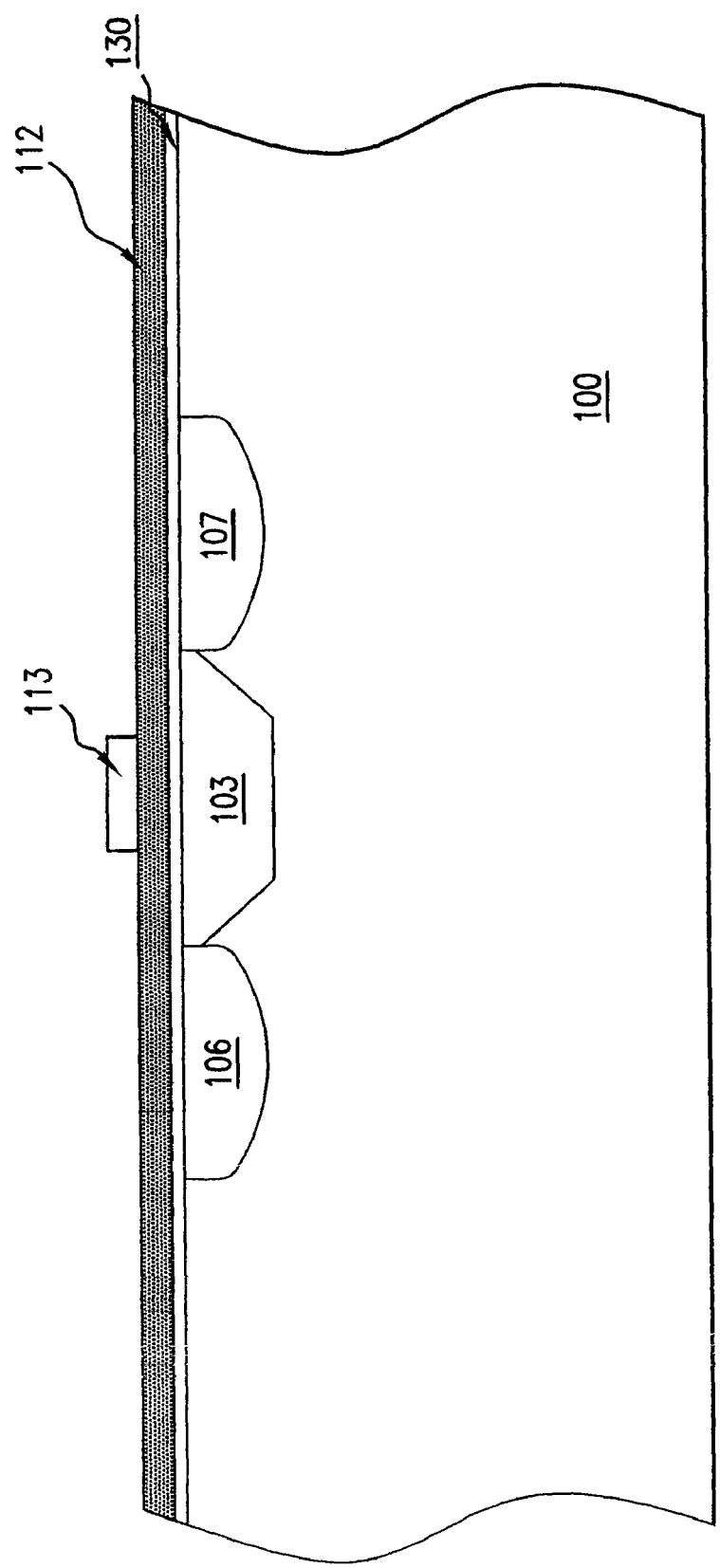
FIG. 5 is an illustration of the memory cell of FIG. 4 at a subsequent stage of fabrication.

FIG. 5 shows a conductive layer 113 that is selectively deposited over the aluminum oxide layer 112. After patterning, the conductive layer 113 is located over the isolation trench 103. The conductive layer 113 may be any type of conductor used in conventional gate structures, and is preferably formed of the same material as the other transistor gates 104, 105 of the memory cell 200.

Figure 5A:
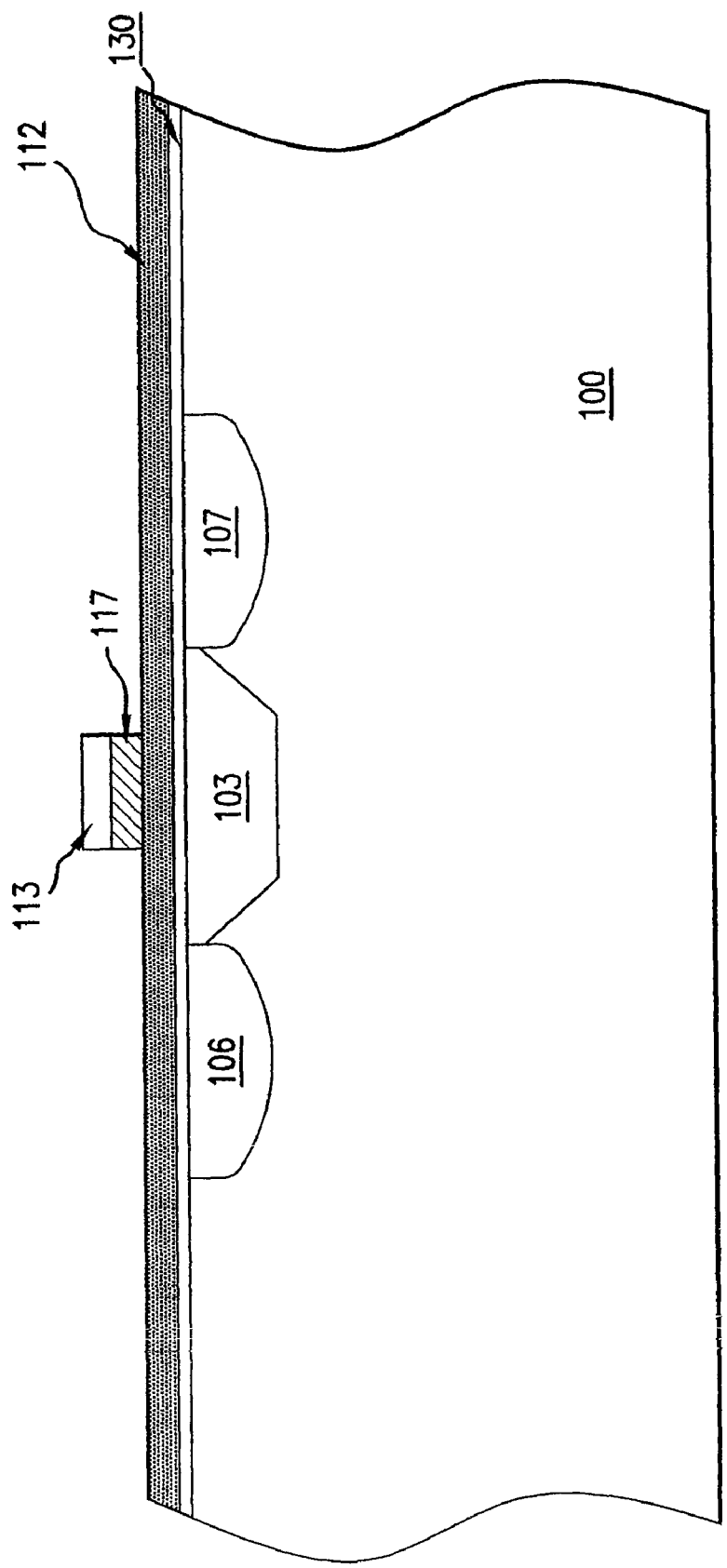
FIG. 5A is an illustration of an exemplary memory cell constructed in accordance with the invention at a stage of fabrication subsequent to that of FIG. 4.

It should be understood that alternatively, an additional gate dielectric 117 may be deposited over the aluminum oxide layer 112 before the conductive layer 113 is deposited, as shown in FIG. 5A. This additional dielectric layer 117 may be any suitable gate dielectric including, but not limited to, a silicon dioxide layer. Like the conductive layer 113, this additional dielectric layer 117 is patterned for deposit only over the area where the gate 110 is to be formed. This step could be done simultaneously with the deposition of the first dielectric layer for the gates of other transistors 104, 105 on the array. If so, the dielectric material 117 would also be selectively deposited where the gatestacks for the transistors 104, 105 are to be formed.

Figure 6:
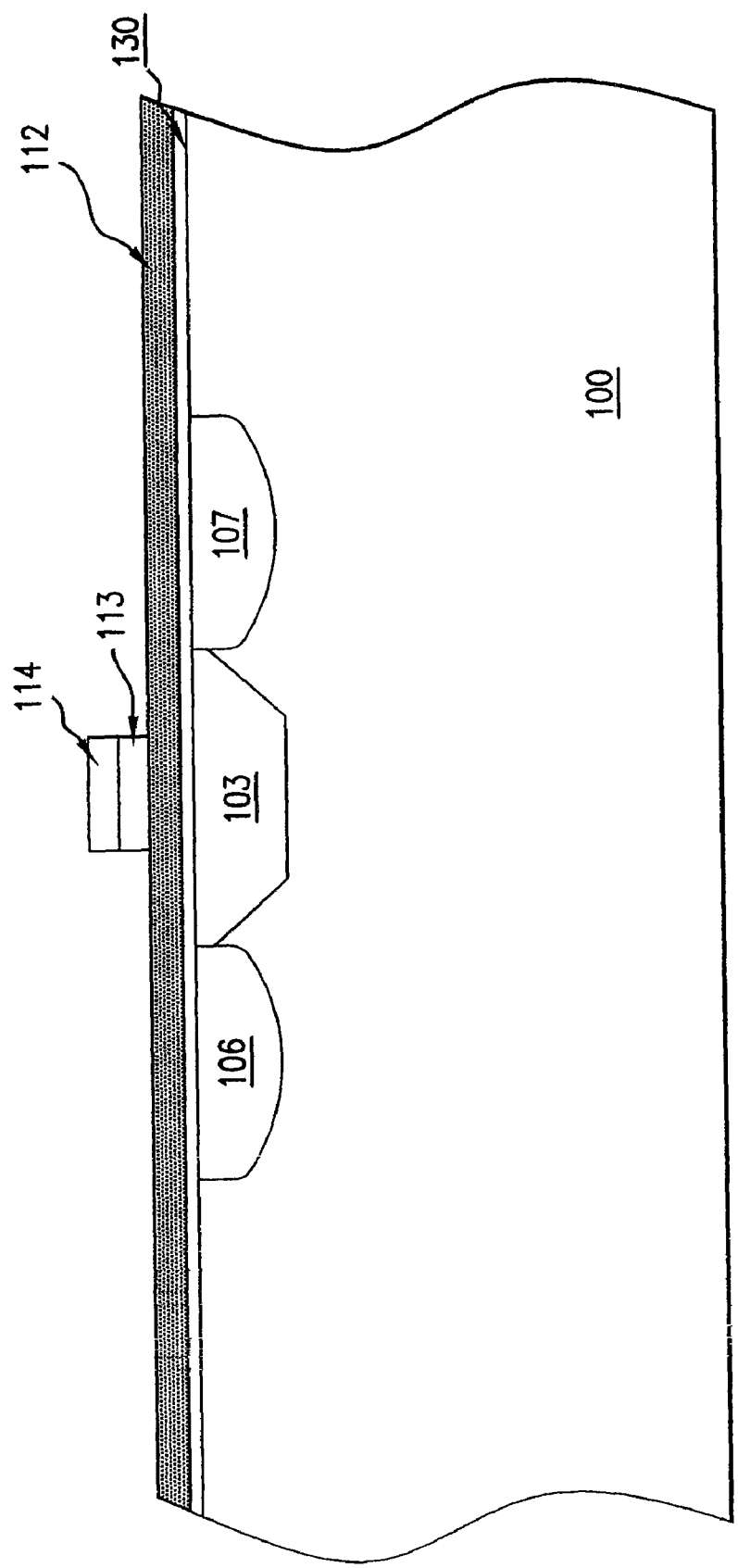
FIG. 6 is an illustration of the memory cell of FIG. 5 at a subsequent stage of fabrication.

FIG. 6 shows the next step in forming the isolation gate 110, with reference back to the memory cell 200 after completion of the steps shown in FIG. 5. A dielectric layer 114 is selectively deposited over the conductive layer 113. The dielectric layer 114 can be any suitable gate insulating layer compatible with the other layers of the gatestack, and may be for example, a nitride or an oxide. The dielectric layer is pattern-deposited over the electrode layer 113.

Figure 7:
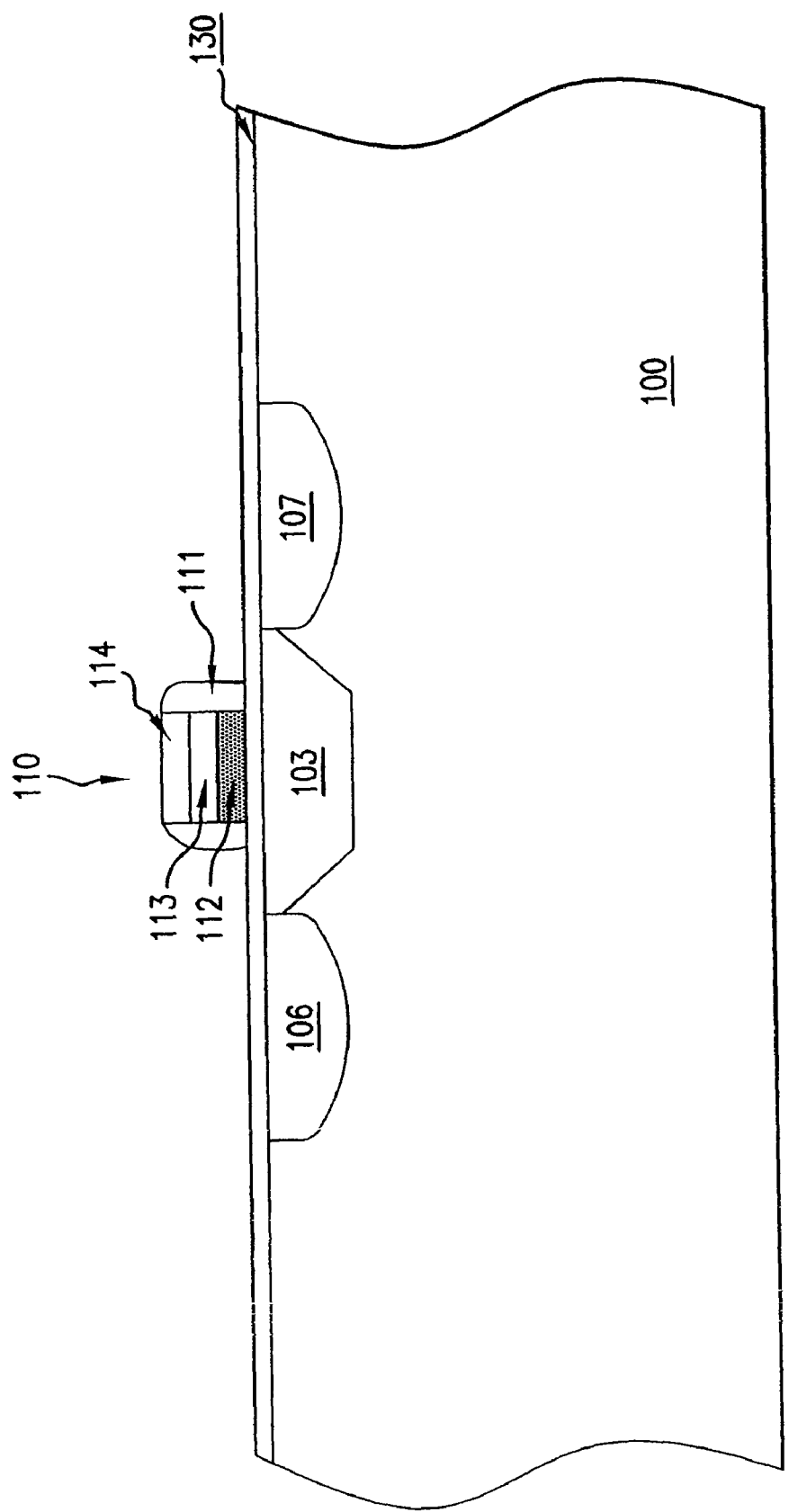
FIG. 7 is an illustration of the memory cell of FIG. 6 at a subsequent stage of fabrication.

FIG. 7 shows that the aluminum oxide 112 is etched with any suitable etchant, by using a mask over the gatestack 110 to etch the aluminum oxide 112 everywhere except under the conductive and dielectric layers, 113 and 114, respectively. This completes the isolation gate stack 110. Insulating sidewalls 111 may be formed on either or each side of the isolation gate stack 110. Sidewalls 111 may be formed of oxide, nitride, or any other suitable insulating material.

Conventional processing steps may then be carried out to complete formation of the memory cells. For instance, with reference to the exemplary cells 200 of FIG. 2A, transistors 104, 105 can be formed using any suitable method and using conventional gate oxide layer, e.g., silicon dioxide, in the gatestacks. The transistor gatestacks are located above and electrically connected to the source drain regions 106, 107. To the extent feasible, the conductive and second dielectric layers of the gatestacks of the transistors 104, 105 may be formed at the same time as the formation of the isolation gate 110. If so, this requires that the aluminum oxide is selectively etched, as discussed with reference to FIG. 7, as soon as it is deposited. Then, conductive layer 113 and dielectric layer 114, can be selectively deposited for each transistor 104, 105 gatestack and also as part of the isolation gatestack. Capacitors 108, 109 are formed using any suitable method and are electrically connected to an associated bit line on the memory array 201 (FIG. 2B) through the transistors 104, 105.

The isolation gate 110 as just described may be implemented in memory cell arrays using a wide variety of transistor and capacitor configurations. In addition, the invention may be utilized to provide isolation for very high density memory cells, such as in $6F^2$ or $4F^2$ cells as discussed above. This invention is in no way limited to a specific design of the memory cell.

Figure 8:
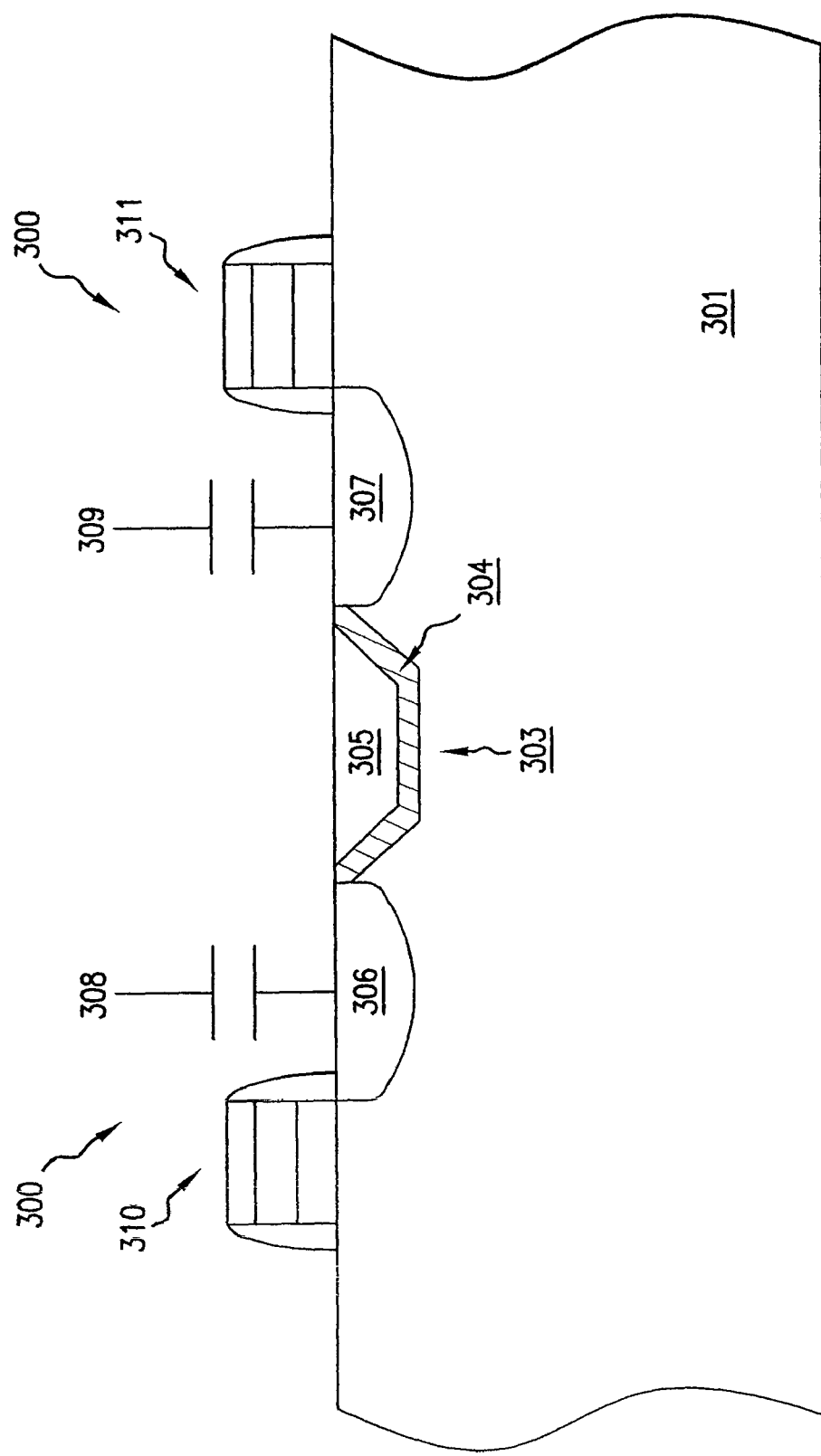
FIG. 8 is a is a cross-sectional view of two adjacent memory cells constructed in accordance with a second exemplary embodiment of the invention.

FIG. 8 illustrates a second embodiment of the invention. Here, the active regions of two memory cells 300 are separated by a trench isolation region 303 that utilizes aluminum oxide as a thin lining 304 within an isolation trench. The trench may be formed by anisotropic etching, or any other suitable method, to a depth of about 1,000 to about 4,000 Angstroms. The aluminum oxide layer 304 is deposited to line the trench. The aluminum oxide may be deposited over the entire surface of the substrate 301 to insure that the side walls and bottom of the trench are coated. Chemical vapor disposition, plasma vapor deposition, or any other suitable technique may be used to deposit the aluminum oxide layer 304 to a thickness of about 30 to about 500 Angstroms, preferably about 50 to 100 Angstroms. Alternatively, a suitable high-k dielectric material, such as aluminum nitride or other silicon-rich aluminum oxides, may be used instead of the aluminum oxide.

Subsequently, a dielectric material 305 is deposited in the trench region 303. Any suitable dielectric material may be used; for example, the trench can be filled with silicon dioxide, silicon nitride, oxide-nitride, or oxide-nitride-oxide. The entire substrate 301 is planarized, removing excess dielectric material 305 as well as any aluminum oxide 304, from the surface of the substrate 301. Conventional processing steps are then used to complete formation of the memory cell, including formation of capacitors 308, 309 and transistors 310, 311 and other memory cell elements as desired.

Similar to the memory cells 200 discussed above with reference to FIG. 2A, the memory cells 300 are isolated by a highly effective isolation region 303. Utilizing aluminum oxide as a trench liner 304 will minimize the current leakage across the region 303, thereby better isolating active areas of the memory cell 300.

Like the grounded gate 110 (shown in FIG. 2A), the trench isolation region 303 of the second embodiment is in no way limited to the design or configurations of the memory cell 300. The trench isolation region 303 constructed in accordance with the present invention may be utilized to isolate active areas between any adjacent memory cells, without being limited to a specific configuration.

It should be appreciated that the isolation region provided by the first and second embodiments of the invention may also be used in conjunction with each other and with other isolation structures and techniques. For example, the isolation gatestack 110 may be constructed, as described above, over an isolation trench region 303 having an aluminum oxide liner. The invention can also be combined with other known isolation techniques for memory cells that are not described in detail herein.

Figure 9:
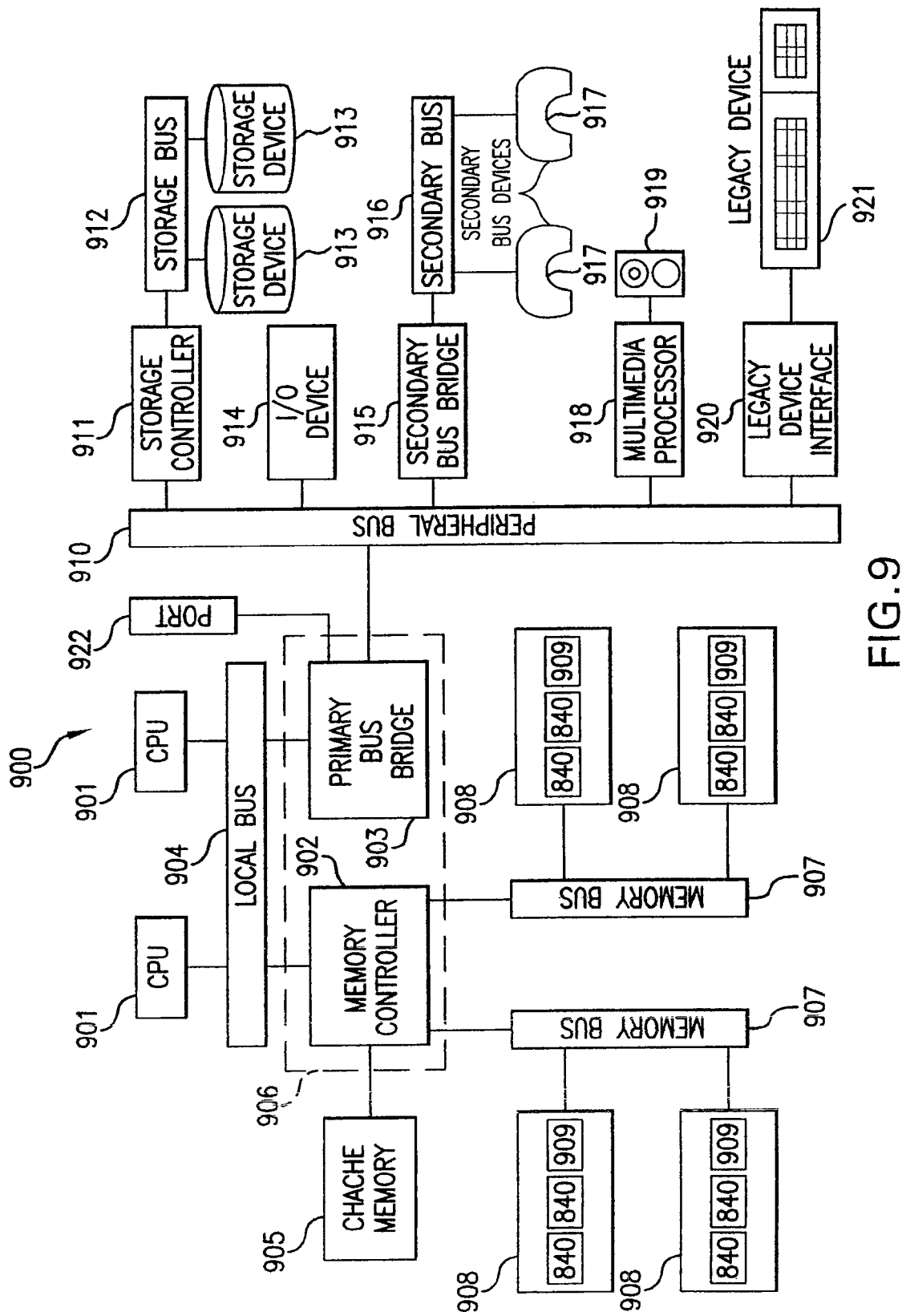
FIG. 9 is a schematic diagram of a processing system employing a DRAM memory cell constructed in accordance with the present invention.

FIG. 9 illustrates an exemplary processing system 900 that utilizes a memory device 840 containing an array 201 of DRAM memory cells 200 or 300 isolated as described above. The processing system 900 includes one or more processors 901 coupled to a local bus 904. A memory controller 902 and a primary bus bridge 903 are also coupled the local bus 904. The processing system 900 may include multiple memory controllers 902 and/or multiple primary bus bridges 903. The memory controller 902 and the primary bus bridge 903 may be integrated as a single device 906.

The memory controller 902 is also coupled to one or more memory buses 907. Each memory bus accepts memory components 908, which include at least one memory device 840 containing the improved isolation region in accordance with the invention. Alternatively, in a simplified system, the memory controller 902 may be omitted and the memory components directly coupled to one or more processors 901. The memory components 908 may be a memory card or a memory module. The memory components 908 may include one or more additional devices 909. For example, the additional device 909 might be a configuration memory. The memory controller 902 may also be coupled to a cache memory 905. The cache memory 905 may be the only cache memory in the processing system. Alternatively, other devices, for example, processors 901 may also include cache memories, which may form a cache hierarchy with cache memory 905. If the processing system 900 include peripherals or controllers which are bus masters or which support direct memory access (DMA), the memory controller 902 may implement a cache coherency protocol. If the memory controller 902 is coupled to a plurality of memory buses 907, each memory bus 907 may be operated in parallel, or different address ranges may be mapped to different memory buses 907.

The primary bus bridge 903 is coupled to at least one peripheral bus 910. Various devices, such as peripherals or additional bus bridges may be coupled to the peripheral bus 910. These devices may include a storage controller 911, an miscellaneous I/O device 914, a secondary bus bridge 915, a multimedia processor 918, and an legacy device interface 920. The primary bus bridge 903 may also coupled to one or more special purpose high speed ports 922. In a personal computer, for example, the special purpose port might be the Accelerated Graphics Port (AGP), used to couple a high performance video card to the processing system 900.

The storage controller 911 couples one or more storage devices 913, via a storage bus 912, to the peripheral bus 910. For example, the storage controller 911 may be a SCSI controller and storage devices 913 may be SCSI discs. The I/O device 914 may be any sort of peripheral. For example, the I/O device 914 may be an local area network interface, such as an Ethernet card. The secondary bus bridge may be used to interface additional devices via another bus to the processing system. For example, the secondary bus bridge may be an universal serial port (USB) controller used to couple USB devices 917 via to the processing system 900. The multimedia processor 918 may be a sound card, a video capture card, or any other type of media interface, which may also be coupled to one additional devices such as speakers 919. The legacy device interface 920 is used to couple legacy devices, for example, older styled keyboards and mice, to the processing system 900.

The processing system 900 illustrated in FIG. 9 is only an exemplary processing system with which the invention may be used. While FIG. 9 illustrates a processing architecture especially suitable for a general purpose computer, such as a personal computer or a workstation, it should be recognized that well known modifications can be made to configure the processing system 900 to become more suitable for use in a variety of applications. For example, many electronic devices which require processing may be implemented using a simpler architecture which relies on a CPU 901 coupled to memory components 908 and/or memory elements 200. The modifications may include, for example, elimination of unnecessary components, addition of specialized devices or circuits, and/or integration of a plurality of devices.

The description and drawings presented above illustrate only a few of the many embodiments which achieve the features and advantages of the present invention. Modification and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A method of isolating active areas of a memory cell array, the method comprising:
   providing a plurality of memory cells formed on a substrate and being arranged into rows and columns, each memory cell comprising an access transistor and a capacitor;
   providing a plurality of wordlines, each wordline electrically connected to a respective access transistor in each memory cell in a row;

providing a plurality of bit lines, each bit line electrically connected to a respective capacitor in each memory cell in a column through a respective access transistor in the memory cell;

providing, a plurality of isolation regions, each isolation region located adjacent to a respective capacitor in at least one memory cell in a row, said isolation region comprising an isolation gate and a substrate region comprising a trench, said isolation gate comprising an isolation gate electrode and a gate dielectric comprising a layer of aluminum oxide, the gate dielectric formed over the trench; and applying a voltage potential to said gate dielectric such that said isolation region is capable of forming a hole accumulation region surrounding said trench.

2. The memory cell array of claim 1, wherein said trench has a depth of less than about 2000 angstroms.

3. The memory cell array of claim 1, wherein said array is a high density dynamic access memory (DRAM) array.

4. A method of forming a memory cell array, the method comprising:

forming a plurality of memory cells formed on a substrate and being arranged into rows and columns, each memory cell comprising an access transistor and a capacitor;

forming a plurality of wordlines, each wordline electrically connected to a respective access transistor in each memory cell in a row;

forming a plurality of bit lines, each bit line electrically connected to a respective capacitor in each memory cell in a column through a respective access transistor in the memory cell; and forming a plurality of isolation regions, each isolation region located adjacent to a respective capacitor in at least one memory cell in a row, wherein forming said isolation region comprises the steps of:

forming a substrate region, said step of forming a substrate region comprising forming a trench and lining the trench with aluminum oxide; and forming an isolation gate, said step of forming an isolation gate comprising forming an isolation gate electrode and forming over the trench a gate dielectric comprising a layer of aluminum oxide.

5. A computer system, comprising:

a processor; and a dynamic random access memory (DRAM) array fabricated on a semiconductor chip communicating with the processor, said DRAM array comprising:

a plurality of DRAM memory cells formed on a substrate and being arranged into rows and columns, each memory cell comprising an access transistor and a capacitor;

a plurality of wordlines, each wordline electrically connected to a respective access transistor in each memory cell in a row;

a plurality of bit lines, each bit line electrically connected to a respective capacitor in each memory cell in a column through a respective access transistor in the memory cell; and a plurality of isolation regions, each isolation region located adjacent to a respective capacitor in at least one memory cell in a row, said isolation region comprising an isolation gate and a substrate region comprising a trench, said isolation gate comprising an isolation gate electrode and a gate dielectric comprising a layer of aluminum oxide, the gate dielectric formed over the trench, wherein said isolation gate electrode is arranged to receive and apply a voltage potential to said gate dielectric such that said isolation region is capable of forming a hole accumulation region surrounding said trench.

6. The computer system of claim 5, wherein at least one isolation gate is a PMOS gate and said isolation gate electrode is driven to between 50 mV and 400 mV when applying said voltage potential to form said hole accumulation region.

7. The computer system of claim 5, wherein at least one isolation gate is an NMOS gate and said isolation gate electrode is driven to between −50 mV and −400 mV when applying said voltage potential to form said hole accumulation region.

8. The computer system of claim 5, wherein said isolation gate electrode is driven to ground when applying said voltage potential to form said hole accumulation region.

\* \* \* \* \*

UNITED STATES PATENT AND TRADEMARK OFFICE
CERTIFICATE OF CORRECTION

PATENT NO. : 8,278,182 B2  
APPLICATION NO. : 13/314976  
DATED : October 2, 2012  
INVENTOR(S) : Chandra Mouli Page 1 of 1

It is certified that error appears in the above-identified patent and that said Letters Patent is hereby corrected as shown below:

ON THE TITLE PAGE:

Item (54), and Column 1, line 2, in Title, delete "$AL_1O_3$" and insert -- $AL_2O_3$ --, therefor.

Item (56), under "Other Publications", in column 2, line 1, delete "$Al_2O_3$" and insert -- $Al_2O_3$ --, therefor.

Item (56), under "Other Publications", in column 2, line 1, delete "dieleteric" an insert -- dielectric --, therefor.

Item (56), under "Other Publications", in column 2, line 4, delete "$Al_2O_3$" and insert -- $Al_2O_3$ --, therefor.

Item (56), under "Other Publications", in column 2, line 4, delete "dieletric" and insert -- dielectric --, therefor.

Item (57), under "Abstract", in column 2, line 5, delete "(Al2O3)" and insert -- ($Al_2O_3$) --, therefor.

Signed and Sealed this
Eighteenth Day of December, 2012

David J. Kappos
*Director of the United States Patent and Trademark Office*